United States Patent
Shao et al.

(10) Patent No.: US 10,768,468 B2
(45) Date of Patent: Sep. 8, 2020

(54) DISPLAY SUBSTRATE HAVING WIDE-COLOR GAMUT, ITS MANUFACTURING METHOD, DISPLAY PANEL AND DISPLAY DEVICE

(71) Applicants: BOE TECHNOLOGY GROUP CO., LTD., Beijing (CN); Fuzhou BOE Optoelectronics Technology Co., Ltd., Fuzhou, Fujian (CN)

(72) Inventors: Xibin Shao, Beijing (CN); Dongxi Li, Beijing (CN); Huibin Guo, Beijing (CN); Jianfeng Yuan, Beijing (CN)

(73) Assignees: BOE TECHNOLOGY GROUP CO., LTD., Beijing (CN); FUZHOU BOE OPTOELECTRONICS TECHNOLOGY CO., LTD., Fuzhou, Fujian (CN)

( * ) Notice: Subject to any disclaimer, the term of this patent is extended or adjusted under 35 U.S.C. 154(b) by 28 days.

(21) Appl. No.: 15/690,022

(22) Filed: Aug. 29, 2017

(65) Prior Publication Data
US 2018/0196305 A1    Jul. 12, 2018

(30) Foreign Application Priority Data
Jan. 10, 2017    (CN) .......................... 2017 1 0015731

(51) Int. Cl.
*G02F 1/1335*    (2006.01)
*G02B 5/20*    (2006.01)
(Continued)

(52) U.S. Cl.
CPC ....... *G02F 1/133514* (2013.01); *G02B 5/207* (2013.01); *G02B 5/223* (2013.01);
(Continued)

(58) Field of Classification Search
CPC ......... G02F 1/133514; G02F 1/133509; G02F 2001/133624; G02F 2001/133521;
(Continued)

(56) References Cited

U.S. PATENT DOCUMENTS 5,982,541 A * 11/1999 Li ........................ H04N 9/3105
                                                    348/E9.027
2001/0017371 A1* 8/2001 Tanaka .............. G02F 1/133345
                                                    257/59
(Continued)

FOREIGN PATENT DOCUMENTS

CN    101821851 A    9/2010
CN    103676288 A    3/2014
(Continued)

OTHER PUBLICATIONS

First Office Action for Chinese Application No. 201710015731.7, dated Dec. 29, 2018, 7 Pages.

*Primary Examiner* — Stephen W Smoot
*Assistant Examiner* — Vicki B. Booker
(74) *Attorney, Agent, or Firm* — Brooks Kushman P.C.

(57) ABSTRACT

The present disclosure provides a display substrate and a method for manufacturing the same, a display panel and a display device. The display substrate includes a base substrate; and a composite film structure formed on the base substrate and composed of at least two thin films having different refractive indexes, wherein the composite film structure is capable of absorbing light with a wavelength in a predetermined wavelength range, and the predetermined wavelength range is located between two adjacent peaks of visible light waves.

12 Claims, 4 Drawing Sheets

(51) Int. Cl.
*G02B 5/22* (2006.01)
*H01L 27/12* (2006.01)
*G02F 1/13357* (2006.01)

(52) U.S. Cl.
CPC .... *G02F 1/133509* (2013.01); *H01L 27/1218* (2013.01); *H01L 27/1262* (2013.01); *G02F 2001/133521* (2013.01); *G02F 2001/133624* (2013.01)

(58) Field of Classification Search
CPC ............. G02F 1/136209; G02F 1/1362; G02F 1/1333; G02F 1/133; H01L 27/1262; H01L 27/1218; H01L 2021/775; H01L 27/1259; H01L 27/1214; H01L 21/77; G02B 5/207; G02B 5/223; G02B 5/201

See application file for complete search history.

(56) References Cited

U.S. PATENT DOCUMENTS

| | | | |
|---|---|---|---|
| 2004/0169924 A1* | 9/2004 | Flagello | G02B 5/3058 359/485.01 |
| 2005/0035353 A1* | 2/2005 | Adachi | H01L 27/12 257/72 |
| 2008/0273142 A1* | 11/2008 | Hirota | G02F 1/133514 349/62 |
| 2009/0072693 A1* | 3/2009 | Cok | H01L 27/3213 313/110 |
| 2013/0037828 A1* | 2/2013 | Moon | H01L 51/5268 257/88 |
| 2013/0114121 A1 | 5/2013 | Hong et al. | |
| 2013/0242237 A1* | 9/2013 | Nagato | G02F 1/133509 349/105 |
| 2017/0017120 A1* | 1/2017 | Choi | G02F 1/133621 |

FOREIGN PATENT DOCUMENTS

| | | |
|---|---|---|
| CN | 103917912 A | 7/2014 |
| KR | 20120077666 A | 7/2012 |

\* cited by examiner

DISPLAY SUBSTRATE HAVING WIDE-COLOR GAMUT, ITS MANUFACTURING METHOD, DISPLAY PANEL AND DISPLAY DEVICE

CROSS-REFERENCE TO RELATED APPLICATION

This application claims priority to Chinese Patent Application No. 201710015731.7 filed on Jan. 10, 2017, which is incorporated herein by reference in its entirety.

TECHNICAL FIELD

The present disclosure relates to the field of display technology, in particular to a display substrate, its manufacturing method, a display panel and a display device.

BACKGROUND

Color gamut is one of key indexes for measuring display performance of a display device. To improve the color gamut of the display device, it is common in prior art to equip the display device with a backlight having wide color gamut or with color filters having wide color gamut.

As for equipping the display device with the backlight having the wide color gamut, the backlight having the wide color gamut is obtained by changing the backlight from a white LED (light emitting diode) to R (red)/G (green)/B (blue) LEDs. However, this will require increased manufacturing precision of the backlight, thereby increasing its manufacturing cost.

As for equipping the display device with the color filters having the wide color gamut, the color filters having the wide color gamut promote light from the backlight to become a narrower transmission spectrum in each waveband of R/G/B when the light passes through the color filters. However, this requires improved materials for forming the color filters, and a lot of research will be needed to obtain suitable materials and the research cost will be relatively high.

SUMMARY

In view of the above, the present disclosure provides a display substrate and a method for manufacturing the same, which enables wide color gamut of the display device at relatively low cost.

Further, the present disclosure provides a display panel including the display substrate and a display device including the display panel.

To solve the above-mentioned technical problems, the present disclosure provides the following technical solutions.

According to one aspect, the present disclosure provides a display substrate including a base substrate and a composite film structure formed on the base substrate and composed of at least two thin films having different refractive indexes, wherein the composite film structure is capable of absorbing light with a wavelength in a predetermined wavelength range, and the predetermined wavelength range is located between two adjacent peaks of visible light waves.

Optionally, the at least two thin films having different refractive indexes are selected from a silicon dioxide thin film, a silicon nitride thin film, a polyimide thin film, a poly(methyl methacrylate) thin film, a poly(ethylene terephthalate) thin film, a hydrogenated amorphous silicon thin film, and a polycrystalline silicon thin film.

Optionally, the composite film structure includes a silicon dioxide thin film and a silicon nitride thin film superposed one on another.

Optionally, the silicon nitride thin film has a thickness between 450 and 495 angstroms, and the silicon dioxide thin film has a thickness between 1800 and 2200 angstroms.

Optionally, the silicon nitride thin film has a thickness of 450 angstroms and the silicon dioxide thin film has a thickness of 2000 angstroms.

Optionally, the base substrate has a first surface which is a light entering side of the display substrate, and the composite film structure is provided on the first surface.

Optionally, the display substrate is an array substrate or a color filter substrate.

According to another aspect, the present disclosure further provides a method for manufacturing a display substrate, including:

providing a base substrate; and forming, on the base substrate, a composite film structure composed of at least two thin films having different refractive indexes, wherein the composite film structure is capable of absorbing light with a wavelength in a predetermined wavelength range, and the predetermined wavelength range is located between two adjacent peaks of visible light waves.

Optionally, the method further includes forming the composite film structure on a first surface of the base substrate, wherein the first surface is a light entering side of the display substrate; and forming a thin film transistor array on a second surface of the base substrate facing away from the first surface, wherein the display substrate is an array substrate.

Optionally, the forming the composite film structure on the first surface of the base substrate includes:

depositing a silicon nitride thin film with a thickness between 405 and 495 angstroms on the first surface; and depositing a silicon dioxide thin film with a thickness between 1800 and 2200 angstroms on the silicon nitride thin film.

According to a further aspect, the present disclosure provides a display panel, including the display substrate as described above, and also an opposed substrate arranged opposite to the display substrate to form a cell.

According to still another aspect, the present disclosure further provides a display device including a backlight and the display panel as described above, wherein the opposed substrate is located at a side of the display substrate facing away from the backlight.

At least one embodiment of the present disclosure produces the following advantageous effect: in the display substrate of the at least one embodiment according to the present disclosure, the composite film structure is capable of absorbing light with a wavelength in a predetermined wavelength range which is located between two adjacent peaks of visible light waves. Therefore, a narrower transmission spectrum of light in each waveband of R/G/B can be obtained when light entering the display substrate passes through the color filters, thereby achieving wide color gamut of the display device.

LIST OF REFERENCE SIGNS

1: existing display panel; 2—color filter substrate; 3: array substrate; 4: silicon nitride thin film; and 5: silicon dioxide thin film.

DETAILED DESCRIPTION

In order to make the technical problems to be solved, technical solutions and advantages of the present disclosure more apparent, the present disclosure will be described hereinafter in detail in conjunction with the drawings and specific embodiments.

The present disclosure provides a display substrate and a method for manufacturing the same, a display panel and a display device, which enable the wide color gamut of the display device at relatively low cost.

Embodiment 1

Color gamut, as one of key indexes of display performance, has great impact on the display performance of the display device. In order to improve the color gamut of the display device, it is common in the prior art to equip the display device with a backlight having wide color gamut or with a color filter having wide color gamut.

Figure 1:
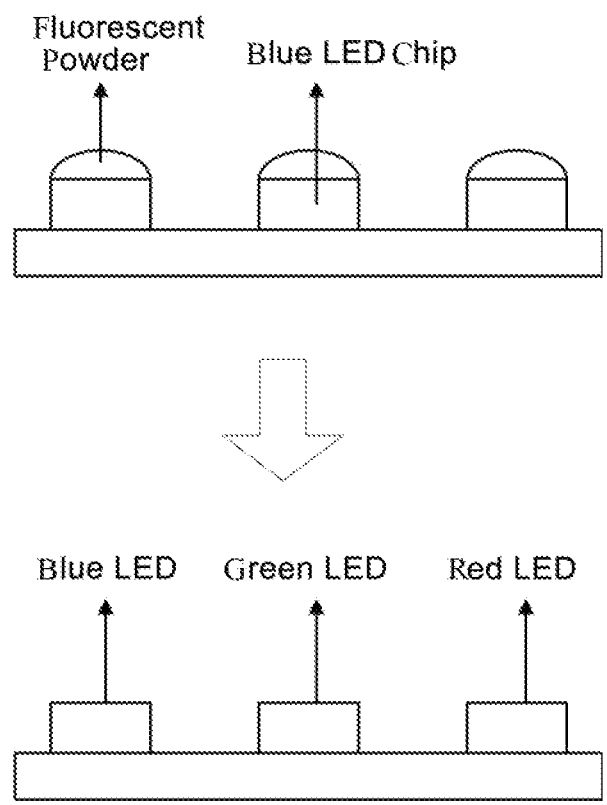
FIG. 1 is a schematic diagram of a backlight having wide color gamut provided in a display device in the prior art.

As shown in FIG. 1, the wide color gamut of the display device is achieved by improving light source performance of a backlight. In this solution, a white LED of the backlight is changed to R/G/B LEDs to obtain the backlight having wide color gamut. However, this will require increased manufacturing precision of the backlight, thereby increasing its manufacturing cost.

Figure 2:
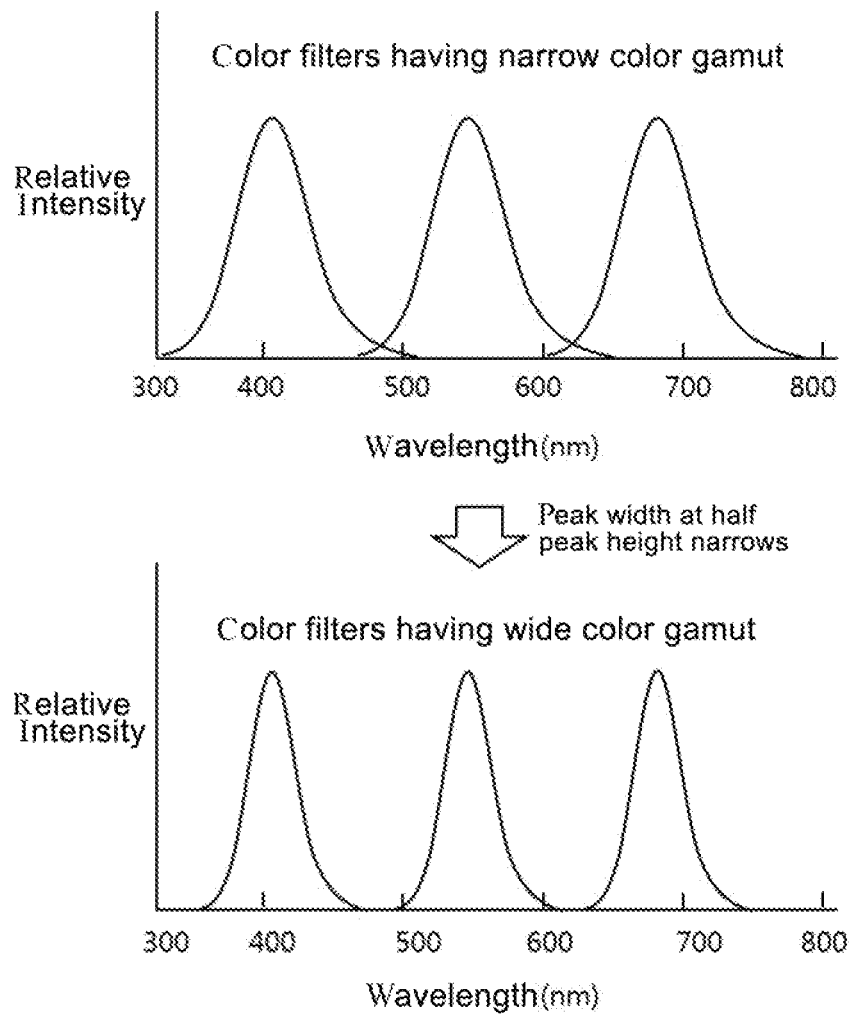
FIG. 2 is a schematic diagram of a color filter having wide color gamut provided in a display device in the prior art.

As shown in FIG. 2, the wide color gamut of the display device is achieved by color filters having wide color gamut. In this solution, the color filters having the wide color gamut promote light from the backlight to become a narrower transmission spectrum in each waveband of R/G/B when the light passes through the color filters. However, this requires improved materials for forming the color filters, and a lot of research will be needed to obtain suitable materials and the research cost will be relatively high.

In order to reduce the cost, this embodiment provides a display substrate different from the existing display substrates. In this embodiment, a composite film structure composed of at least two thin films having different refractive indexes is formed on a base substrate, and is capable of absorbing light with a wavelength in a predetermined wavelength range located between two adjacent peaks of visible light waves. The base substrate has a first surface which is a light entering side of the display substrate, and the composite film structure is formed on the first surface.

In this embodiment, the composite film structure formed on the base substrate is composed of the at least two thin film having the different refractive indexes, and thus is able to absorb light with a wavelength in a predetermined wavelength range. The predetermined wavelength range is located between two adjacent peaks of visible light waves, i.e., the composite film structure is able to absorb light having a wavelength between the two adjacent peaks of visible light waves, so that a narrower light spectrum in each waveband of R/G/B will be obtained when the light entering the display substrate passes through the color filters. For example, the composite film structure is able to absorb light having a wavelength near 580 nm, thus it can reduce the transmission of red light through green color filter and that of green light through red color filter, thereby achieving the wide color gamut of the display device.

In this embodiment, the composite film structure is composed of two or three thin films having different refractive indexes. Each of the thin films has high transmittance in the visible light range, which is usually 85% or higher. By adjusting thicknesses of the thin films having the different refractive indexes, the composite film structure is able to absorb light having a wavelength between two adjacent peaks of visible light waves.

Specifically, the at least two thin films having the different refractive indexes may be selected from a silicon dioxide thin film, a silicon nitride thin film, a polyimide thin film, a poly(methyl methacrylate) thin film, a poly(ethylene terephthalate) thin film, a hydrogenated amorphous silicon thin film, and a polycrystalline silicon thin film. When different thin films are selected, it is required to adjust the thicknesses of the thin films so that the composite film structure composed thereof is able to absorb light having a wavelength between two adjacent peaks of visible light waves.

In one specific embodiment, the composite film structure may include a silicon dioxide thin film and a silicon nitride thin film superposed one on another.

Figure 3:
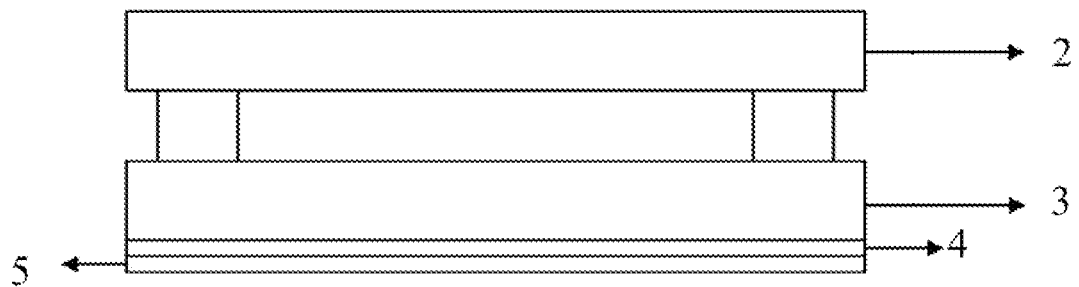
FIGS. 3 and 4 are structural schematic views of a display panel in an embodiment of the present disclosure.
Figure 4:
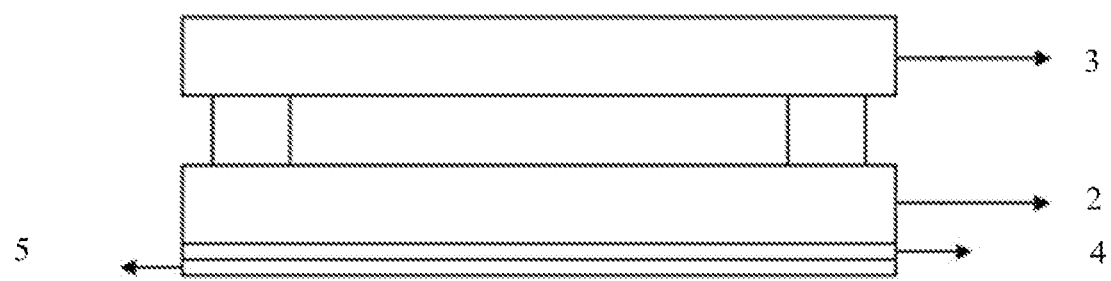

FIGS. 3 and 4 are structural schematic views of a display panel in an embodiment of the present disclosure.

As shown in FIG. 3, a composite film structure is formed on a base substrate, and includes a silicon dioxide thin film 5 and a silicon nitride thin film 4 superposed one on another. The refractive index of silicon dioxide is 1.4, and the refractive index of silicon nitride is 1.8. The silicon nitride thin film has a thickness between 450 and 495 angstroms, and the silicon dioxide thin film has a thickness between 1800 and 2200 angstroms. When the silicon nitride thin film and the silicon dioxide thin film have the thicknesses as described above, they can effectively absorb light having a wavelength between two adjacent peaks of visible light waves.

Specifically, the display substrate is an array substrate. The base substrate has a first surface which is a light entering side of the display substrate, and the composite film structure is provided on the first surface. Since in a common liquid crystal display with a frame, the array substrate is located closer to the backlight than the color filter substrate. The composite film structure formed on the light entering side of the array substrate is able to effectively absorb light emitted from the backlight and having a wavelength between two peaks of visible light waves, thereby improving the utilization of the light emitted from the backlight.

As shown in FIG. 4, for a frameless liquid crystal display, the color filter substrate is located closer to the backlight than the array substrate, thus the composite film structure is located at a light entering side of the color filter substrate.

In this embodiment, the composite film structure is composed of the silicon dioxide thin film and the silicon nitride thin film. Silicon dioxide and silicon nitride are materials commonly used in the manufacturing of a display substrate. Moreover, silicon dioxide and silicon nitride are usually required to be used in the manufacturing of a gate insulating layer and a passivation layer of the display substrate. Therefore, there is no need to change the manufacturing materials and manufacturing device for the existing display substrate when silicon dioxide and silicon nitride are used for manufacturing the composite film structure. As a result, the manufacturing materials and the manufacturing device for the existing display substrate can be used for forming the composite film structure on the display substrate, thereby making it possible to achieve the wide color gamut at relatively low cost.

Figure 5:
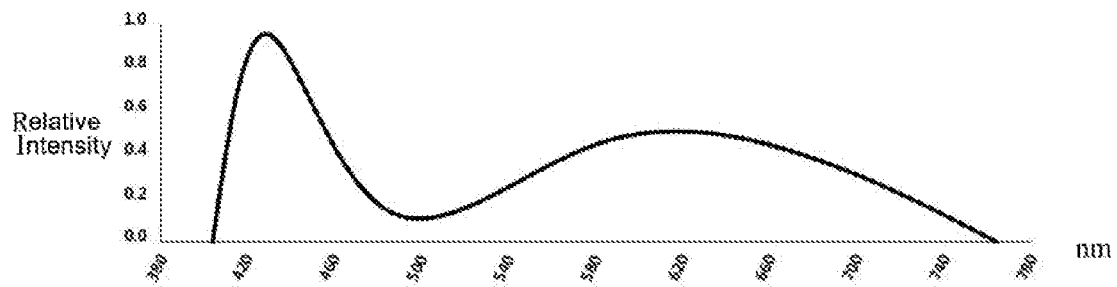
FIG. 5 is a schematic diagram of a spectrum of light from a backlight before entering the composite film structure in an embodiment of the present disclosure.
Figure 6:
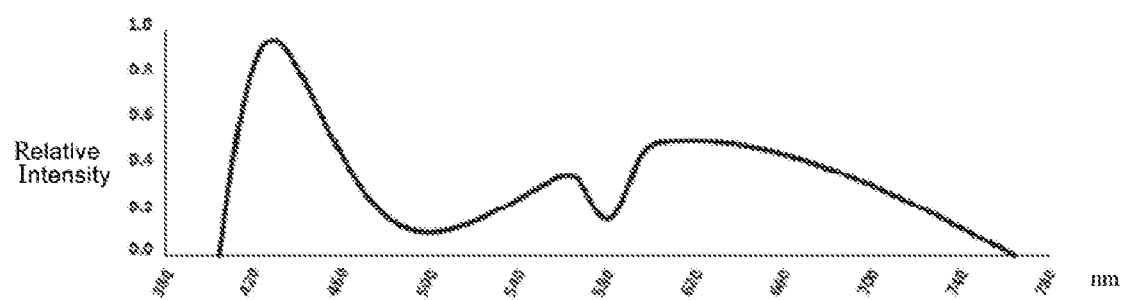
FIG. 6 is a schematic diagram of a spectrum of light exiting the composite film structure in the embodiment of the present disclosure.

Further, the thickness of the silicon nitride thin film is 450 angstroms, and the thickness of the silicon dioxide thin film is 2000 angstroms. When the silicon nitride thin film and the silicon dioxide thin film have the thicknesses as given above, light between two adjacent peaks of visible light waves can be effectively absorbed. A schematic diagram of a spectrum of light from a backlight before entering the composite film structure is shown in FIG. 5, and a schematic diagram of a spectrum of light exiting the composite film structure is shown in FIG. 6. As can be seen from FIGS. 5 and 6, when the wavelength is near 580 nm, the composite film structure has one absorbing peak. This absorbing peak is located between a peak of red light and that of green light, thus the transmission of red light through green color filter and that of green light through red color filter can be reduced so as to achieve the wide color gamut of the display device.

Embodiment 2

This embodiment provides a method for manufacturing a display substrate, including:

providing a base substrate; and forming, on the base substrate, a composite film structure composed of at least two thin films having different refractive indexes, wherein the composite film structure is capable of absorbing light with a wavelength in a predetermined wavelength range, and the predetermined wavelength range is located between two adjacent peaks of visible light waves.

In this embodiment, the composite film structure formed on the base substrate is composed of the at least two thin film having the different refractive indexes, and thus is able to absorb light with a wavelength in a predetermined wavelength range. The predetermined wavelength range is located between two adjacent peaks of visible light waves, i.e., the composite film structure is able to absorb light having a wavelength between the two adjacent peaks of visible light waves, so that a narrower light spectrum in each waveband of R/G/B will be obtained when the light entering the display substrate passes through the color filters. For example, the composite film structure is able to absorb light having a wavelength near 580 nm, thus it can reduce the transmission of red light through green color filter and that of green light through red color filter, thereby achieving the wide color gamut of the display device.

Optionally, the method further includes:

forming the composite film structure on a first surface of the base substrate, wherein the first surface is a light entering side of the display substrate; and forming a thin film transistor array on a second surface of the base substrate facing away from the first surface, wherein the display substrate is an array substrate. The process of forming the thin film transistor array is consistent with that of forming the existing array substrate, and thus will not repeated here.

Specifically, the at least two thin films having the different refractive indexes may be selected from a silicon dioxide thin film, a silicon nitride thin film, a polyimide thin film, a poly(methyl methacrylate) thin film, a poly(ethylene terephthalate) thin film, a hydrogenated amorphous silicon thin film, and a polycrystalline silicon thin film. When different thin films are selected, it is required to adjust the thicknesses of the thin films so that the composite film structure composed thereof is able to absorb light having a wavelength between two adjacent peaks of visible light waves.

In a specific embodiment, the composite film structure may include a silicon dioxide thin film and a silicon nitride thin film superposed one on another.

Optionally, the forming the composite film structure on the first surface of the base substrate includes: depositing a silicon nitride thin film with a thickness between 405 and 495 angstroms on the first surface; and depositing a silicon dioxide thin film with a thickness between 1800 and 2200 angstroms on the silicon nitride thin film In this embodiment, the composite film structure is composed of the silicon dioxide thin film and the silicon nitride thin film. Silicon dioxide and silicon nitride are materials commonly used in the manufacturing of a display substrate. Moreover, silicon dioxide and silicon nitride are usually required to be used in the manufacturing of a gate insulating layer and a passivation layer of the display substrate. Therefore, there is no need to change the manufacturing materials and manufacturing device for the existing display substrate when silicon dioxide and silicon nitride are used for manufacturing the composite film structure. As a result, the manufacturing materials and the manufacturing device for the existing display substrate can be used for forming the composite film structure on the display substrate, thereby making it possible to achieve the wide color gamut at relatively low cost This embodiment will be explained by taking the composite film structure located at the light entering side of the array substrate for example. In addition, for a frameless liquid crystal display, the color filter substrate is located closer to the backlight than the array substrate, thus the composite film structure may be located at the light entering side of the color filter substrate.

Embodiment 3

This embodiment provides a display panel, including the display substrate as described in embodiment 2, and also an opposed substrate arranged opposite to the display substrate to form a cell.

The display substrate may be an array substrate, and the opposed substrate may be a color filter substrate. The construction of the color filter substrate is consistent with the construction of the color filter substrate in the existing liquid crystal display panel, and will not be repeated here. When the composite film structure in this embodiment is composed of the silicon dioxide thin film and the silicon nitride thin film, the composite film structure formed on the array substrate in this embodiment can reduce the transmission of red light through green color filter and that of green light through red color filter, thereby achieving the wide color gamut of the display panel.

In addition, for a frameless liquid crystal display device, the display substrate may be a color filter substrate and the opposed substrate may be an array substrate.

Embodiment 4

This embodiment may provide a display device including a backlight and the display panel as described in embodiment 3. The opposed substrate is located at a side of the display substrate facing away from the backlight.

The display device may be any product or component having a display function, such as a liquid crystal television, a liquid crystal display, a digital photo frame, a mobile phone, a tablet computer, and the like, wherein the display device further includes a flexible circuit board, a printed circuit board, and a backplane.

The above are optional embodiments of the present disclosure, and it shall be indicated that several improvements and modifications may be made by a person skilled in the art without departing from the principle of the present disclosure, and such improvements and modifications should be also considered to fall within the protection scope of the present disclosure.

What is claimed is:

1. A display substrate, comprising:
   a base substrate; and
   a composite film structure formed on the base substrate and composed of at least two thin films having different refractive indexes, wherein the composite film structure is configured to absorb light with a wavelength in a predetermined wavelength range, and the predetermined wavelength range is located between two adjacent peaks of visible light waves, and wherein the composite film structure comprises a silicon dioxide thin film and a silicon nitride thin film superposed one on another, the silicon nitride thin film completely overlaps with the silicon dioxide thin film and is in direct physical contact with the silicon dioxide thin film, the silicon nitride thin film has a thickness between 450 and 495 angstroms, the silicon dioxide thin film has a thickness between 1800 and 2200 angstroms, and the silicon dioxide has a refractive index of 1.4 and the silicon nitride has a refractive index of 1.8 such that the composite film structure is able to absorb light having a wavelength near 580 nm.

2. The display substrate according to claim 1, wherein the silicon nitride thin film has a thickness of 450 angstroms and the silicon dioxide thin film has a thickness of 2000 angstroms.

3. The display substrate according to claim 1, wherein the base substrate has a first surface which is a light-entering side of the display substrate, and the composite film structure is provided on the first surface.

4. The display substrate according to claim 1, wherein the display substrate is an array substrate or a color filter substrate.

5. A display panel, comprising the display substrate according to claim 1, and an opposed substrate arranged opposite to the display substrate to form a cell.

6. The display panel according to claim 5, wherein the display substrate is one of an array substrate and a color filter substrate, and the opposed substrate is the other of the array substrate and the color filter substrate.

7. A display device, comprising a backlight and the display panel according to claim 5, wherein the opposed substrate is located at a side of the display substrate facing away from the backlight.

8. The display panel according to claim 5, wherein the silicon nitride thin film has a thickness of 450 angstroms and the silicon dioxide thin film has a thickness of 2000 angstroms.

9. The display substrate according to claim 1, wherein the silicon nitride thin film is provided on the base substrate and the silicon dioxide thin film is provided on a side of the silicon nitride thin film away from the base substrate.

10. A method for manufacturing a display substrate, comprising:
    providing a base substrate; and
    forming, on the base substrate, a composite film structure composed of at least two thin films having different refractive indexes, wherein the composite film structure is configured to absorb light with a wavelength in a predetermined wavelength range, and the predetermined wavelength range is located between two adjacent peaks of visible light waves, and wherein the composite film structure comprises a silicon dioxide thin film and a silicon nitride thin film superposed one on another, the silicon nitride thin film completely overlaps with the silicon dioxide thin film and is in direct physical contact with the silicon dioxide thin film, the silicon nitride thin film has a thickness between 450 and 495 angstroms, the silicon dioxide thin film has a thickness between 1800 and 2200 angstroms, and the silicon dioxide has a refractive index of 1.4 and the silicon nitride has a refractive index of 1.8 such that the composite film structure is able to absorb light having a wavelength near 580 nm.

11. The method according to claim 10, further comprising:
    forming the composite film structure on a first surface of the base substrate, wherein the first surface is a light-entering side of the display substrate; and
    forming a thin film transistor array on a second surface of the base substrate facing away from the first surface, wherein the display substrate is an array substrate.

12. The method according to claim 11, wherein the forming the composite film structure on the first surface of the base substrate comprises:
    depositing a silicon nitride thin film with a thickness between 405 and 495 angstroms on the first surface; and
    depositing a silicon dioxide thin film with a thickness between 1800 and 2200 angstroms on the silicon nitride thin film.

* * * * *